(12) United States Patent
Nakamura et al.

(10) Patent No.: US 7,760,043 B2
(45) Date of Patent: Jul. 20, 2010

(54) POLAR MODULATION APPARATUS

(75) Inventors: Maki Nakamura, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 189 days.

(21) Appl. No.: 12/280,975

(22) PCT Filed: Feb. 27, 2007

(86) PCT No.: PCT/JP2007/053658
§ 371 (c)(1),
(2), (4) Date: Aug. 27, 2008

(87) PCT Pub. No.: WO2007/102343
PCT Pub. Date: Sep. 13, 2007

(65) Prior Publication Data
US 2009/0039974 A1 Feb. 12, 2009

(30) Foreign Application Priority Data
Feb. 28, 2006 (JP) .............................. 2006-053912

(51) Int. Cl.
*H03C 3/00* (2006.01)
*H03C 3/38* (2006.01)
(52) U.S. Cl. ...................................... 332/145; 332/144
(58) Field of Classification Search ................. 332/144, 332/145, 149; 330/10
See application file for complete search history.

(56) References Cited

U.S. PATENT DOCUMENTS
| 6,101,224 | A | 8/2000 | Lindoff | |
|---|---|---|---|---|
| 7,496,334 | B2 * | 2/2009 | Saito | 455/114.3 |
| 2002/0031191 | A1 | 3/2002 | Shimizu | |
| 2005/0008093 | A1 | 1/2005 | Matsuura | |
| 2007/0183530 | A1 | 8/2007 | Udagawa | |
| 2007/0229180 | A1 | 10/2007 | Shimizu | |

(Continued)

FOREIGN PATENT DOCUMENTS
JP   61 146 004   7/1986

(Continued)

OTHER PUBLICATIONS

Japanese Office Action dated Nov. 10, 2009.

(Continued)

*Primary Examiner*—David Mis
(74) *Attorney, Agent, or Firm*—Dickinson Wright PLLC

(57) ABSTRACT

Provided is a polar modulation apparatus capable of performing power limit with a simple configuration even when controlling a transmission power and increasing the transmission signal output power control range. A polar modulation device (1) includes an amplitude limit unit (6) for limiting an amplitude component of an amplitude signal, a D/A converter (7) for converting an inputted digital signal into an analog signal, a power control unit (8) for performing power control so that the inputted signal is an output signal based on the power control signal, a voltage control circuit (9) for supplying voltage to an amplitude modulator (11) according to the output signal from the power control unit (8), an angle modulator (10) for performing angle modulation according to a phase signal, and an amplitude modulator (11) for performing amplitude modulation on the signal subjected to angle modulation, according to the voltage supplied from the voltage control circuit (9).

8 Claims, 14 Drawing Sheets

U.S. PATENT DOCUMENTS

2009/0262863 A1* 10/2009 Ikedo .................. 375/300

FOREIGN PATENT DOCUMENTS

| | | |
|---|---|---|
| JP | 3 285 404 | 12/1991 |
| JP | 05-089592 | 4/1993 |
| JP | 2000/286915 | 10/2000 |
| JP | 2002-094392 | 3/2002 |
| JP | 2002-527921 | 8/2002 |
| JP | 2003-152587 | 5/2003 |
| JP | 2003-283346 | 10/2003 |
| JP | 2004-274148 | 9/2004 |
| JP | 2005-045782 | 2/2005 |
| JP | 2005-295533 | 10/2005 |
| WO | 2006/001433 | 1/2006 |

OTHER PUBLICATIONS

International Search Report dated Jun. 5, 2007 in English.
Notice of Reasons of Rejection on corresponding Japanese Patent Application.

* cited by examiner

NUMBER OF REQUIRED OUTPUT POWERS

FOR OUTPUT POWER 27 dBm

| INPUT VALUE | OUTPUT VALUE |
|---|---|
| 0.0 | 0.00 |
| 0.1 | 0.09 |
| 0.2 | 0.20 |
| .. | .. |
| 1.0 | 0.98 |

⋮

FOR OUTPUT POWER -19 dBm

| INPUT VALUE | OUTPUT VALUE |
|---|---|
| 0.0 | 0.00 |
| 0.1 | 0.11 |
| 0.2 | 0.21 |
| .. | .. |
| 1.0 | 1.03 |

FOR OUTPUT POWER -20 dBm

| INPUT VALUE | OUTPUT VALUE |
|---|---|
| 0.0 | 0.00 |
| 0.1 | 0.12 |
| 0.2 | 0.22 |
| .. | .. |
| 1.0 | 1.05 |

FIG.8

NUMBER OF REQUIRED OUTPUT POWERS

FOR OUTPUT POWER −20 dBm

| INPUT VALUE | OUTPUT VALUE |
|---|---|
| 0.0 | 0.2 |
| 0.1 | 0.2 |
| 0.2 | 0.22 |
| ... | ... |
| 0.7 | 0.72 |
| 0.8 | 0.8 |
| 0.9 | 0.8 |
| 1.0 | 0.8 |

FOR OUTPUT POWER −19 dBm

| INPUT VALUE | OUTPUT VALUE |
|---|---|
| 0.0 | 0.2 |
| 0.1 | 0.2 |
| 0.2 | 0.21 |
| ... | ... |
| 0.7 | 0.69 |
| 0.8 | 0.8 |
| 0.9 | 0.8 |
| 1.0 | 0.8 |

FOR OUTPUT POWER 27 dBm

| INPUT VALUE | OUTPUT VALUE |
|---|---|
| 0.0 | 0.2 |
| 0.1 | 0.2 |
| 0.2 | 0.2 |
| ... | ... |
| 0.7 | 0.68 |
| 0.8 | 0.79 |
| 0.9 | 0.8 |
| 1.0 | 0.8 |

BOTTOM LIMIT — PEAK LIMIT

FIG.11

POLAR MODULATION APPARATUS

TECHNICAL FIELD

The present invention relates to a polar modulation apparatus. More particularly, the present invention relates to a polar modulation apparatus used for a radio communication apparatus for modulating an input signal divided into an amplitude signal and a phase signal.

BACKGROUND ART

Conventionally, when a signal having a wide dynamic range such as UMTS (Universal Mobile Telecommunications System) is amplitude-modulated, there is a proposal of a scheme of reducing a necessary dynamic range by amplitude-limiting an amplitude component thereof in advance (e.g., see Patent Document 1).

FIG. 1 shows an example of a modulation circuit apparatus that performs such amplitude limitation. Modulation circuit apparatus 101 shown in FIG. 1 is configured with angle modulator 102, voltage control circuit 103, amplitude modulator 104 and amplitude limitation section 109.

Angle modulator 102 is a circuit that angle-modulates a carrier wave using a phase signal inputted from second input terminal 106.

Voltage control circuit 103 is a circuit used to supply stable power to amplitude modulator 104 for amplifying an amplitude signal inputted from first input terminal 105.

Amplitude modulator 104 is a circuit that amplitude-modulates a signal inputted from angle modulator 102 using a signal inputted from voltage control circuit 103.

Amplitude limitation section 109 is a circuit that forms, if the level of an upper waveform of an amplitude signal inputted from first input terminal 105 exceeds a first predetermined value, the upper waveform of the amplitude signal so that the level of the amplitude signal of the exceeding portion is truncated to the first predetermined value and/or forms, if the level of the upper waveform of the inputted amplitude signal is greater than the first predetermined value and the level of a lower waveform of the amplitude signal falls below a second predetermined value, the lower waveform of the amplitude signal so that the level of the amplitude signal of the lower portion is truncated to the second predetermined value.

Next, the operation of modulation circuit apparatus 101 in FIG. 1 will be explained.

A data generator (not shown) generates an amplitude signal and a phase signal from an inputted signal. The amplitude signal generated by the data generator is inputted to first input terminal 105 and the phase signal generated by the data generator is inputted to second input terminal 106. A supply voltage is supplied to voltage control circuit 103 from power terminal 107.

Amplitude limitation section 109 limits the amplitude component of the amplitude signal inputted to first input terminal 105 according to the first predetermined value and/or second predetermined value and outputs the amplitude-limited signal to voltage control circuit 103. Voltage control circuit 103 amplifies the signal inputted from amplitude limitation section 109 and then outputs the amplified signal to amplitude modulator 104. By using this voltage control circuit 103, it is possible to supply a stable voltage to amplitude modulator 104. That is, it is possible to avoid voltage changes due to changes in input impedance of amplitude modulator 104 or the like.

Furthermore, the phase signal inputted to second input terminal 106 is inputted to angle modulator 102. Angle modulator 102 angle-modulates the inputted phase signal using a carrier wave and outputs the angle-modulated phase signal to amplitude modulator 104. This angle-modulated signal becomes an angle modulated wave of a constant envelope as shown in the figure. Amplitude modulator 104 then amplitude-modulates the inputted angle-modulated signal using the voltage supplied from voltage control circuit 103 and outputs the amplitude-modulated signal from output terminal 108. Patent Document 1: Japanese Patent Application Laid-Open No. 2005-45782

DISCLOSURE OF INVENTION

Problems to be Solved by the Invention

However, for the actual radio communication apparatus mounted with the above-described modulation circuit apparatus, it is indispensable to control a power value of the output signal of amplitude modulator 104, that is, transmission power. When the above-described modulation circuit apparatus attempts to perform amplitude limitation on the signal whose transmission power is controlled, it is necessary to change the above-described first predetermined value and second predetermined value according to the level of the transmission power.

The above-described conventional modulation circuit apparatus does not take transmission power control into consideration and is difficult to be applied to an actual radio communication apparatus.

It is therefore an object of the present invention to provide a polar modulation apparatus capable of performing power limitation with a simple configuration and expanding a control range of transmission power even when transmission power is controlled.

Means for Solving the Problem

One aspect of the polar modulation apparatus of the present invention employs a configuration having: an amplitude limitation section that performs amplitude limitation on an inputted amplitude signal; a digital to analog conversion section that converts the digital amplitude signal amplitude-limited by the amplitude limitation section to an analog signal; a power control section that scales the amplitude-limited analog amplitude signal according to a transmission power control value; an angle modulation section that performs angle-modulation based on an inputted phase signal and outputs an angle-modulated signal; and an amplitude modulation section that amplitude-modulates the angle-modulated signal using the power controlled amplitude signal.

According to this configuration, amplitude limitation processing is performed before digital/analog conversion, and therefore a dynamic range required for the digital/analog converter is reduced. Furthermore, digital/analog conversion is performed before transmission power control and digital/analog conversion can be performed without depending on a transmission power control value required from the system, so that the dynamic range of the digital/analog converter can be used to a maximum extent.

Furthermore, another aspect of the polar modulation apparatus of the present invention employs a configuration having a compensation section that eliminates a distortion component of an amplitude signal after the amplitude limitation section.

According to this configuration, amplitude limitation is performed before the compensation section, and therefore the signal inputted to the compensation section does not take a greater value than the first predetermined value or a smaller value than the second predetermined value limited by the amplitude limitation section. In this way, the range to be compensated can be reduced and the configuration of the compensation section can be simplified.

Furthermore, a further aspect of the polar modulation apparatus of the present invention employs a configuration having an average output correction section that calculates an average value of the signal outputted from the amplitude limitation section according to the first predetermined value and/or the second predetermined value and corrects the output signal based on the calculated value.

According to this configuration, by calculating an average value of the signal outputted from the amplitude limitation section and correcting an output signal based on the calculated value so that the average value is always kept equal, even when the signal is subjected to amplitude limitation, the required output current can be stably supplied, so that it is possible to avoid deterioration of signal quality.

Advantageous Effect of the Invention

According to the present invention, even when transmission power is controlled, it is possible to limit power with a simple configuration and expand the range of output power control of a transmission signal.

BRIEF DESCRIPTION OF DRAWINGS

FIG. 3 illustrates amplitude limitation operation of Embodiment 1.

FIG. 4 illustrates amplitude limitation operation of Embodiment 1.

FIG. 8 shows an example of a compensation table according to Embodiment 2;

FIG. 11 shows an example of an amplitude-limited compensation table according to Embodiment 2;

BEST MODE FOR CARRYING OUT THE INVENTION

Now, embodiments of the present invention will be described in detail with reference to the accompanying drawings.

Embodiment 1

Figure 1:
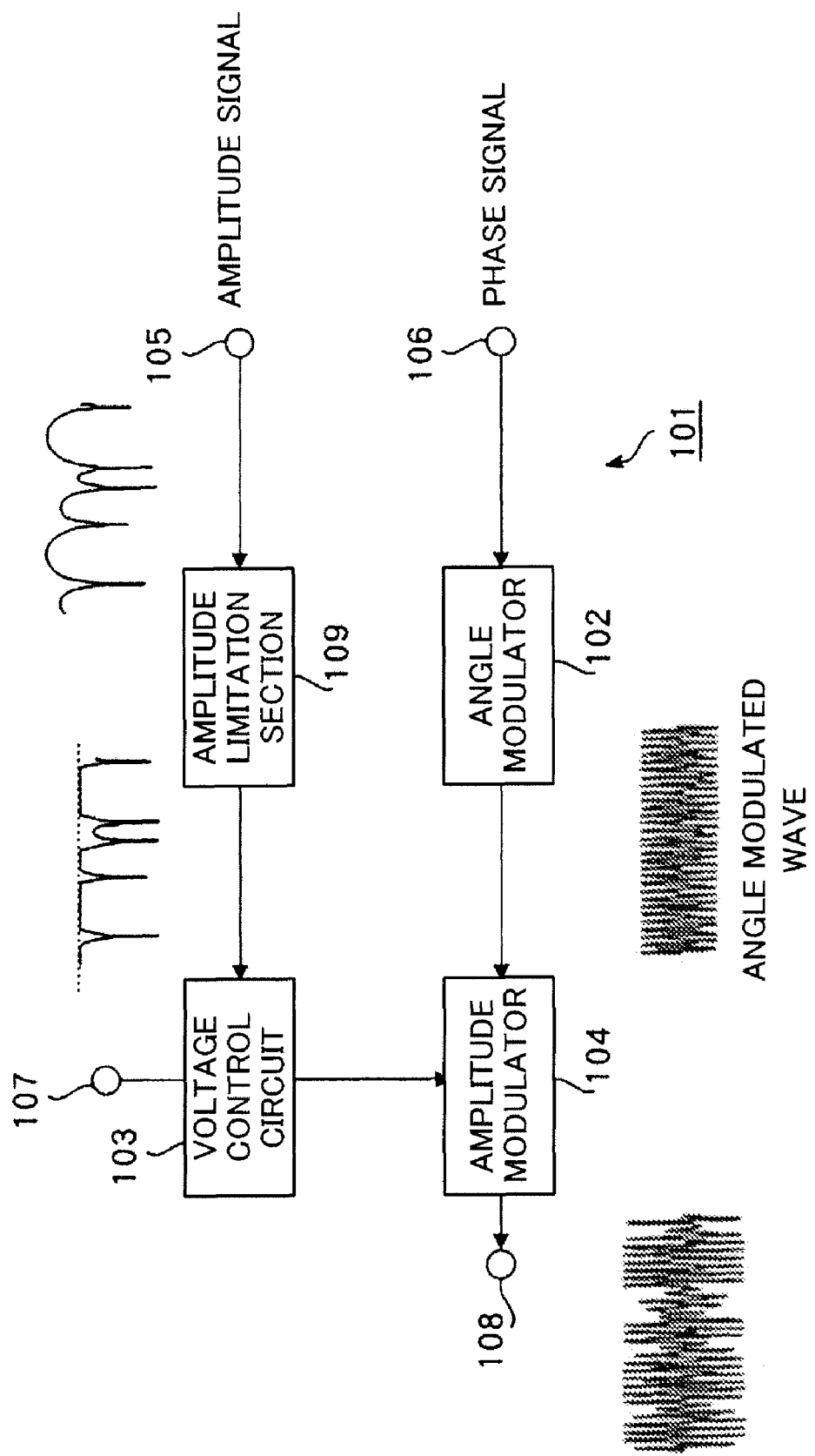
FIG. 1 shows a configuration of a conventional modulation circuit apparatus.
Figure 2:
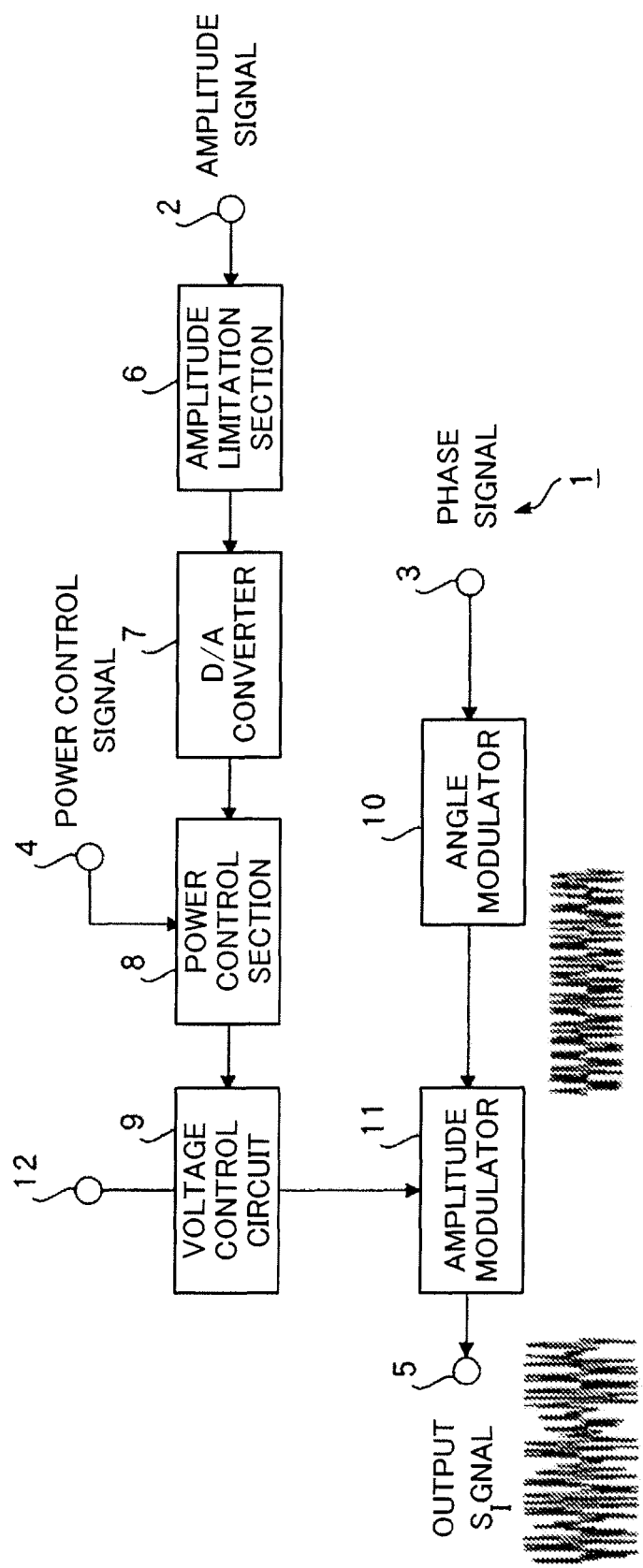
FIG. 2 is a block diagram showing a configuration of a polar modulation apparatus according to Embodiment 1 of the present invention.

FIG. 2 is a block diagram showing a configuration of polar modulation apparatus 1 according to present Embodiment 1. In FIG. 2, polar modulation apparatus 1 is configured with amplitude limitation section 6 that limits an amplitude component of an amplitude signal, D/A converter 7 that converts an inputted digital signal to an analog signal, power control section 8 that performs power control so that the inputted signal becomes an output signal based on a power control signal, voltage control circuit 9 that supplies a voltage to amplitude modulator 11 based on the output signal of power control section 8, angle modulator 10 that performs angle modulation based on a phase signal, and amplitude modulator 11 that amplitude-modulates the angle-modulated signal based on the supply voltage from voltage control circuit 9.

Figure 3A:
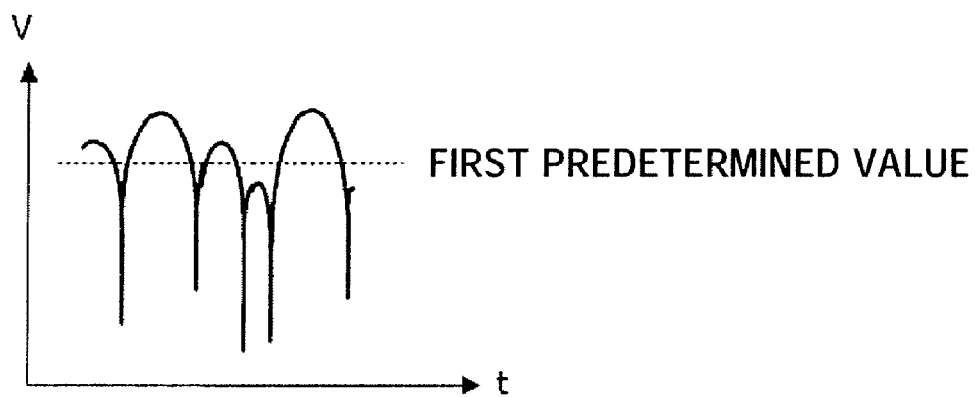
FIG. 3A shows an example of an amplitude signal before amplitude limitation.
Figure 3B:
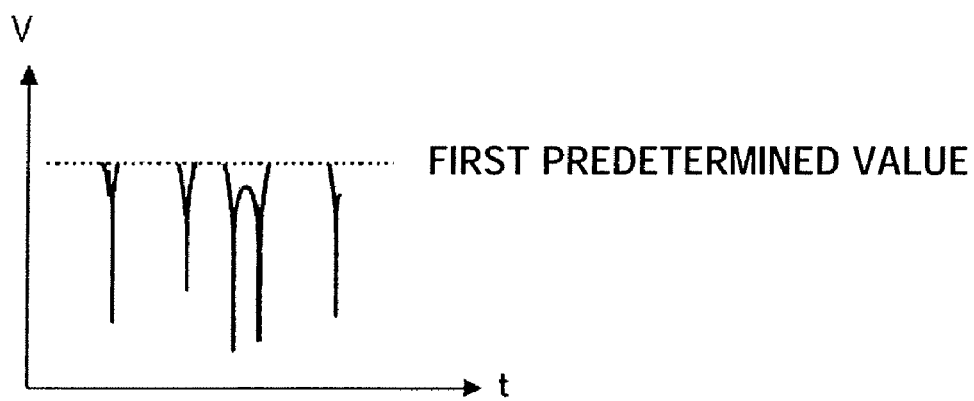
FIG. 3B shows an example of an amplitude signal after amplitude limitation.

As shown in FIG. 3A and FIG. 3B, amplitude limitation section 6 forms, if an upper waveform of an amplitude signal inputted from first input terminal 2 exceeds a first predetermined value (FIG. 3A), the upper waveform of the amplitude signal so that the level of the amplitude signal of the exceeding portion is truncated to the first predetermined value (FIG. 3B).

Figure 4A:
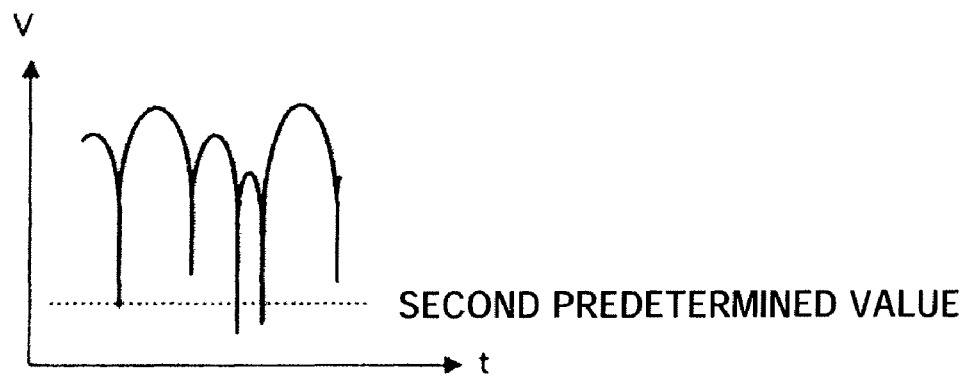
FIG. 4A shows an example of an amplitude signal before amplitude limitation.
Figure 4B:
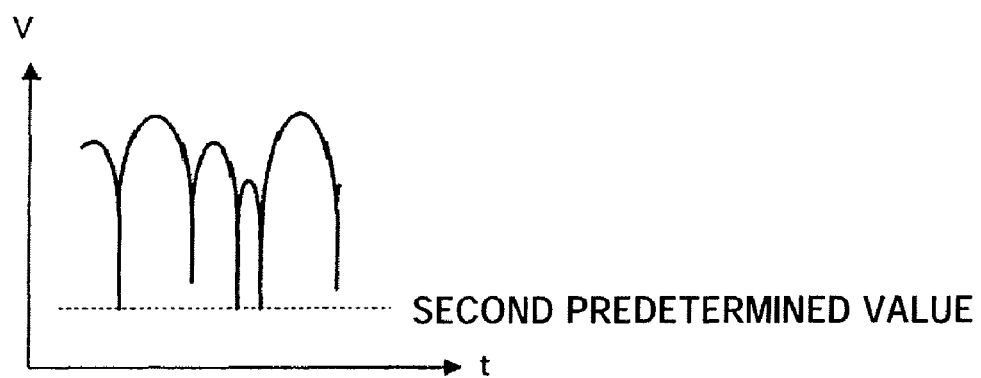
FIG. 4B shows an example of an amplitude signal after amplitude limitation.

Furthermore, as shown in FIG. 4A and FIG. 4B, amplitude limitation section 6 forms, if a lower waveform of the amplitude signal inputted from first input terminal 2 falls below a second predetermined value (FIG. 4A), the lower waveform of the amplitude signal so that the level of the amplitude signal of the lower portion is truncated to the second predetermined value (FIG. 4B).

Figure 5A:
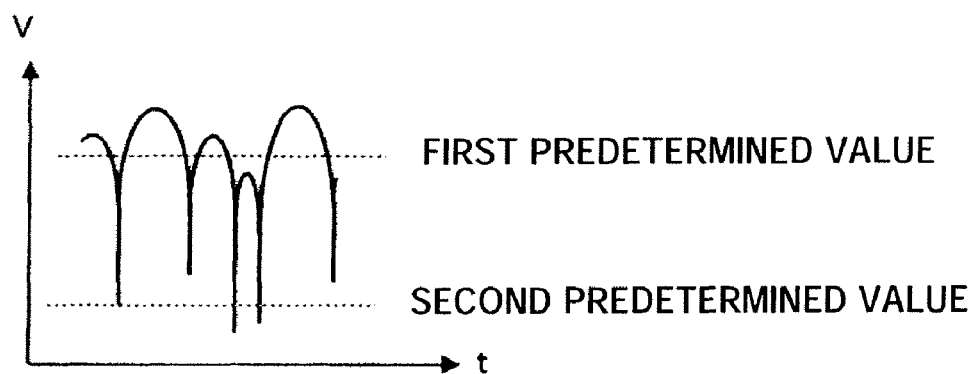
FIG. 5 illustrates amplitude limitation operation of Embodiment 1, FIG. 5 A shows an example of an amplitude signal before amplitude limitation.
FIG. 5B shows an example of an amplitude signal after amplitude limitation.
Figure 5B:
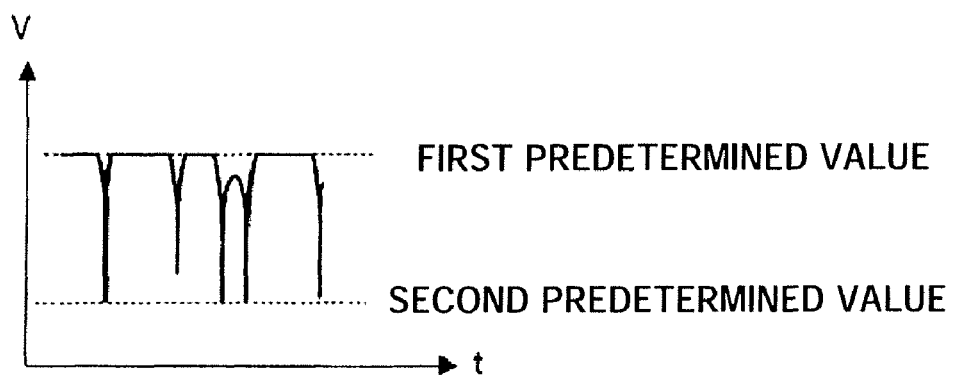

Furthermore, as shown in FIG. 5A and FIG. 5B, if the upper waveform of the amplitude signal inputted from first input terminal 2 exceeds the first predetermined value and the lower waveform thereof falls below the second predetermined value (FIG. 5A), amplitude limitation section 6 forms the upper waveform of the amplitude signal so that the level of the amplitude signal of the exceeding portion is truncated to the first predetermined value and forms the lower waveform of the amplitude signal so that the level of the amplitude signal of the lower portion is truncated to the second predetermined value (FIG. 5B).

D/A converter 7 receives the output signal from amplitude limitation section 6 as input, converts this signal to an analog signal and outputs the analog signal to power control section 8.

Power control section 8 is directed to controlling power of the signal (transmission signal) finally outputted from amplitude modulator 11, scale the output signal of D/A converter 7 according to a power control signal and thereby performs operation so that power of the signal outputted from amplitude modulator 11 becomes a desired value.

Voltage control circuit 9 forms a supply voltage according to the output signal inputted from power control section 8 and supplies this supply voltage to amplitude modulator 11.

Angle modulator 10 performs angle-modulation based on a phase signal inputted from second input terminal 3 and outputs the angle-modulated signal to amplitude modulator 11.

Amplitude modulator 11 amplitude-modulates the angle-modulated signal inputted from angle modulator 10 according to the supply voltage supplied from voltage control circuit 9 and outputs the amplitude-modulated signal from output terminal 5. More specifically, amplitude modulator 11 is made up of a power amplifier and inputs the angle-modulated signal to a signal input terminal and inputs the supply voltage to a power terminal.

As described above, by performing amplitude limitation processing at amplitude limitation section 6 before power control section 8 controls power, amplitude limitation can be performed constantly irrespective of a request from the system (transmission power control), so that it is possible to facilitate amplitude modulation processing.

Furthermore, by performing polar modulation whereby a transmission signal is divided into an amplitude component and a phase component and processed, amplitude limitation only needs to be applied to the amplitude component (if orthogonal modulation is applied, amplitude limitation needs to be performed on an RF signal (analog signal) after IQ combination), and amplitude limitation section 6 can be configured with a digital circuit such as a digital filter, so that it is possible to reduce the circuit scale.

Furthermore, since amplitude limitation processing is performed before D/A conversion, the dynamic range required for D/A converter 7 is also reduced. Furthermore, by performing D/A conversion before power control, D/A conversion can be performed irrespective of a power value (transmission power) required from the system, so that the dynamic range of D/A converter 7 can be used to a maximum extent.

Embodiment 2

Figure 6:
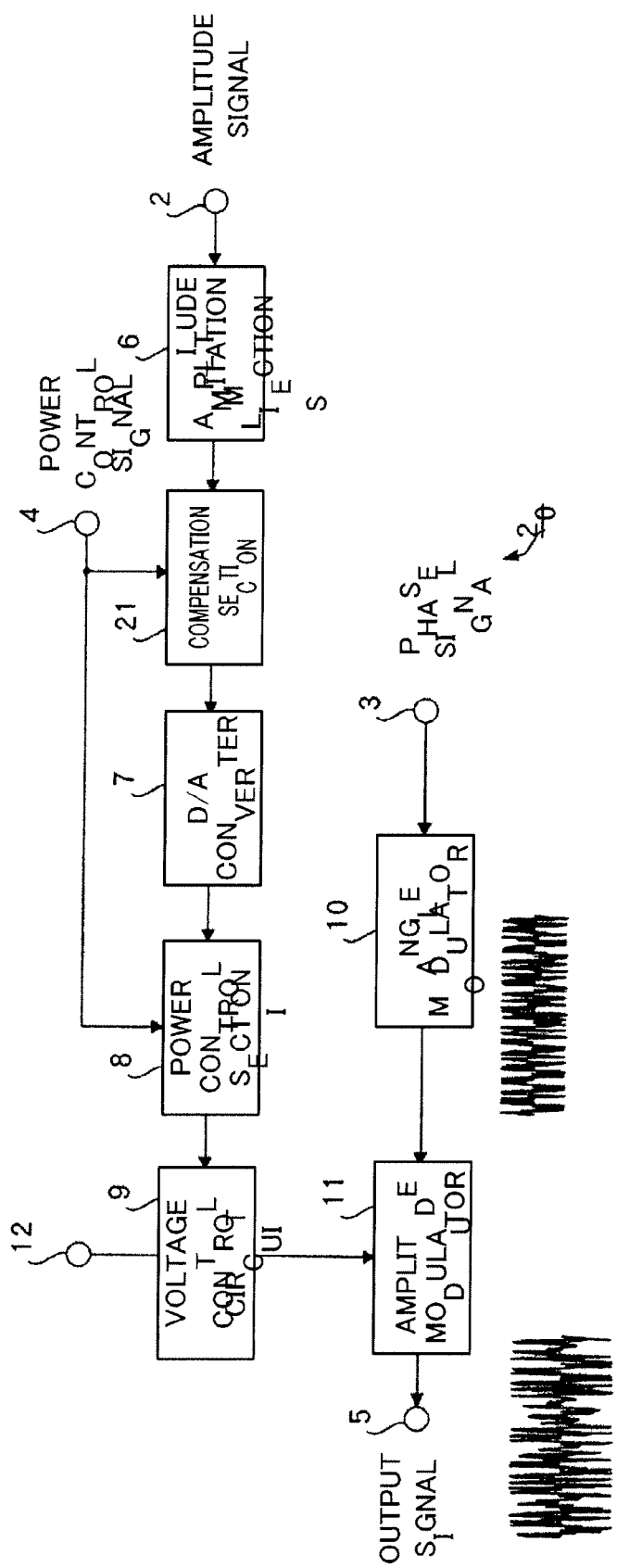
FIG. 6 is a block diagram showing a configuration of a polar modulation apparatus according to Embodiment 2 of the present invention.

FIG. 6 shows a configuration of polar modulation apparatus 20 according to present Embodiment 2. In FIG. 6, the same components as those of polar modulation apparatus 1 shown in FIG. 2 above will be assigned the same reference numerals and explanations thereof will be omitted.

As shown in FIG. 6, polar modulation apparatus 20 according to present Embodiment 2 has compensation section 21 that corrects an amplitude signal using a table to eliminate a distortion component of an output signal (transmission signal) in addition to the configuration of Embodiment 1 shown in FIG. 2.

Figure 7:
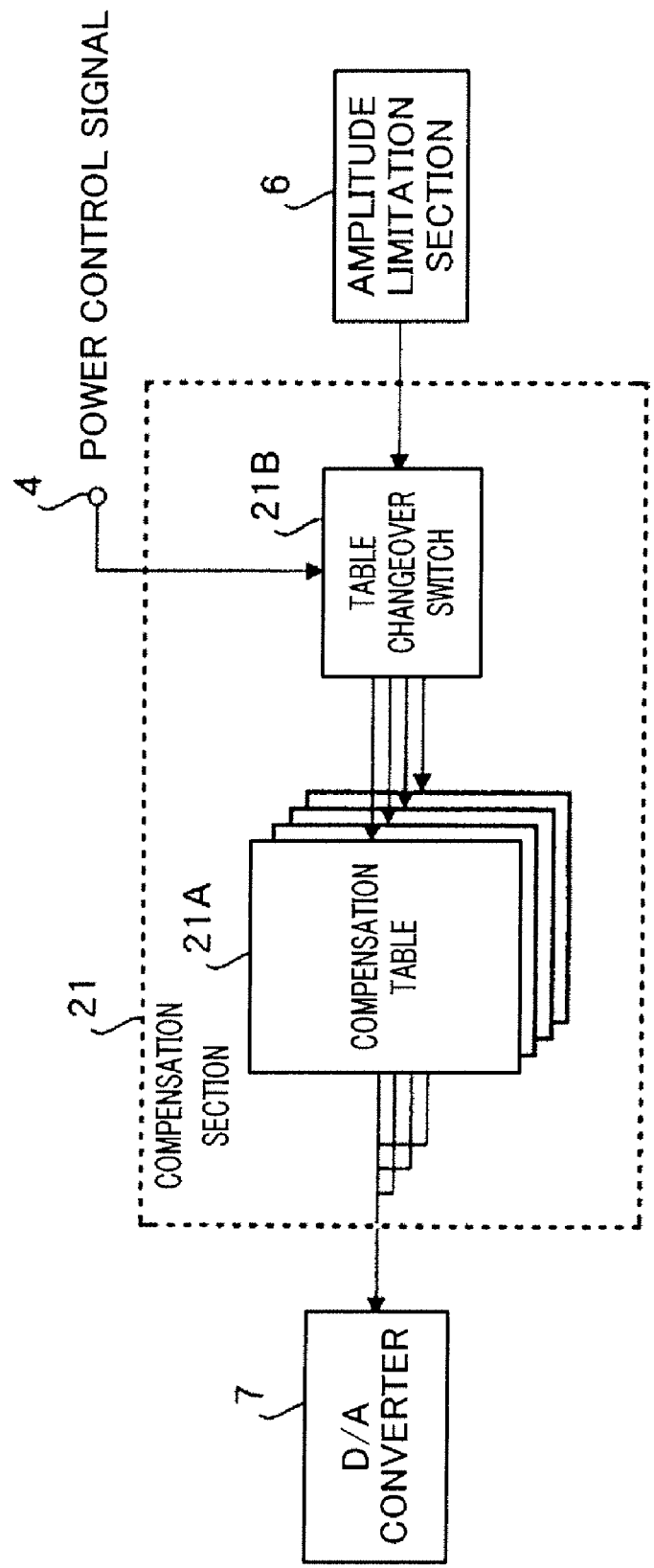
FIG. 7 shows a configuration of a compensation section according to Embodiment 2.

As shown in FIG. 7, compensation section 21 is made up of compensation table 21A including a plurality of compensation tables and table changeover switch 21B that selects compensation table 21A to be used to compensate for a signal after amplitude limitation. As shown in FIG. 8, compensation table 21A has a plurality of compensation tables matching output power values (transmission power) set in a power control signal. In this case, FIG. 8 illustrates compensation tables for "−20 dBm, −19 dBm, . . . , 27 dBm" as output power values. Each compensation table sets a relationship between input values and output values matching each output power value. These tables are just a few examples and the setting content and the number of tables or the like can be changed as appropriate in relation to the system.

Table changeover switch 21B selects a compensation table in compensation table 21A according to an output power value shown by a power control signal inputted from control terminal 4.

Next, the operation of polar modulation apparatus 20 in FIG. 6 will be explained centered on differences from Embodiment 1.

As shown in FIG. 6, an output signal from amplitude limitation section 6 is inputted to compensation section 21. In compensation section 21, a compensation table in compensation table 21A is selected by table changeover switch 21B according to a power value shown by a power control signal and the input value of the amplitude-limited input signal is converted to a signal of the matching output value according to the selected compensation table and outputted to D/A converter 7.

In this way, by providing compensation section 21 after amplitude limitation section 6, a signal inputted to compensation section 21 does not become a value greater than the above-described first predetermined value or a value smaller than the above-described second predetermined value limited by amplitude limitation section 6, so that it is possible to reduce the scale of the compensation tables stored in compensation table 21A.

Figure 9:
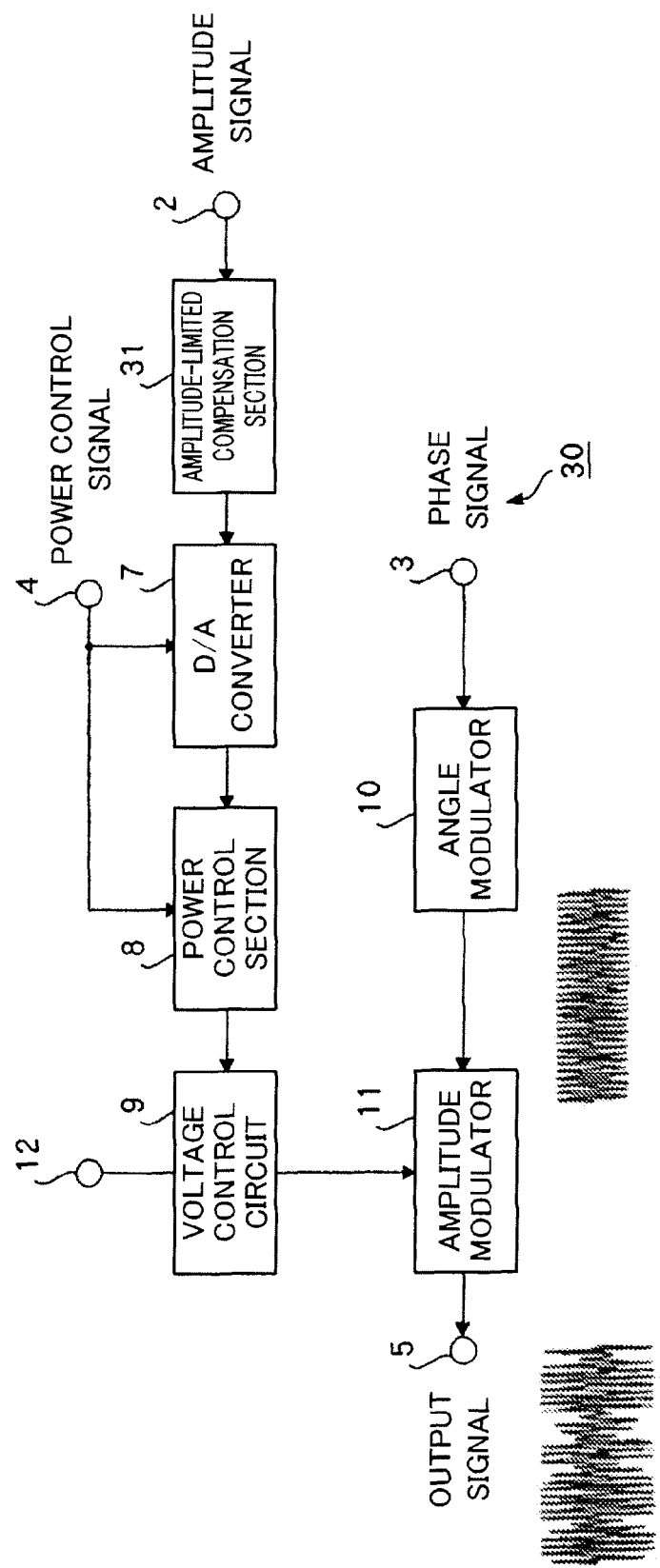
FIG. 9 is a block diagram showing another configuration of the polar modulation apparatus according to Embodiment 2.
Figure 10:
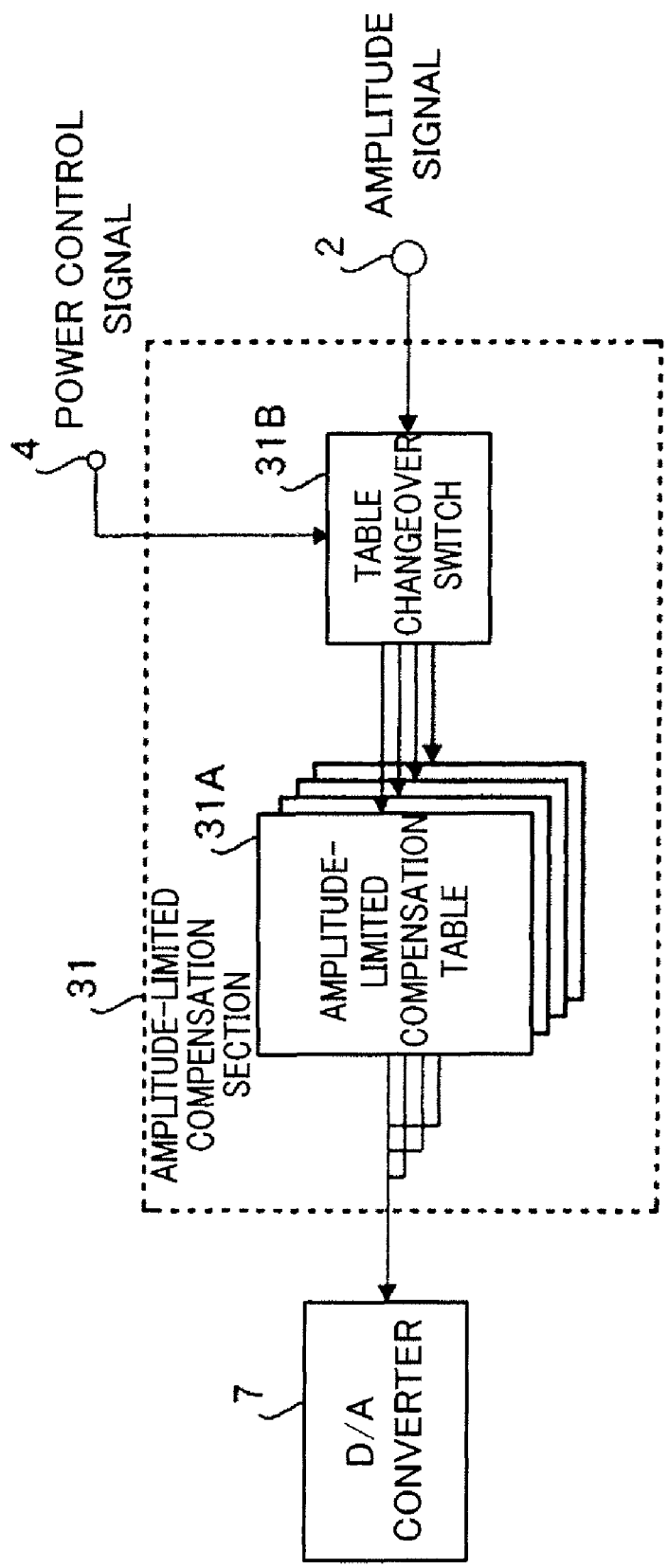
FIG. 10 shows a configuration of an amplitude-limited compensation section according to Embodiment 2.

Amplitude limitation section 6 and compensation section 21 in FIG. 6 may be combined into one amplitude-limited compensation section 31 of polar modulation apparatus 30 shown in FIG. 9. As shown in FIG. 10, this amplitude-limited compensation section 31 is configured with amplitude-limited compensation table 31A having a plurality of amplitude-limited compensation tables and table changeover switch 31B that switches between amplitude-limited compensation tables 31A.

As shown in FIG. 11, amplitude-limited compensation table 31A has a plurality of amplitude-limited compensation tables matching "−20 dBm, −19 dBm, . . . , 27 dBm" as output power values set in a power control signal. Each amplitude-limited compensation table sets values to limit the amplitude of an inputted amplitude signal with a bottom limit (which corresponds to the aforementioned second predetermined value) and a peak limit (which corresponds to the aforementioned first predetermined value) in addition to the settings of the input values and output values shown in FIG. 8 above.

Configuring amplitude-limited compensation section 31 as shown in FIG. 10 and FIG. 11 makes it possible to simultaneously perform compensation and amplitude limitation on an amplitude signal, eliminate the amplitude limitation section and reduce the circuit scale.

Embodiment 3

Figure 12:
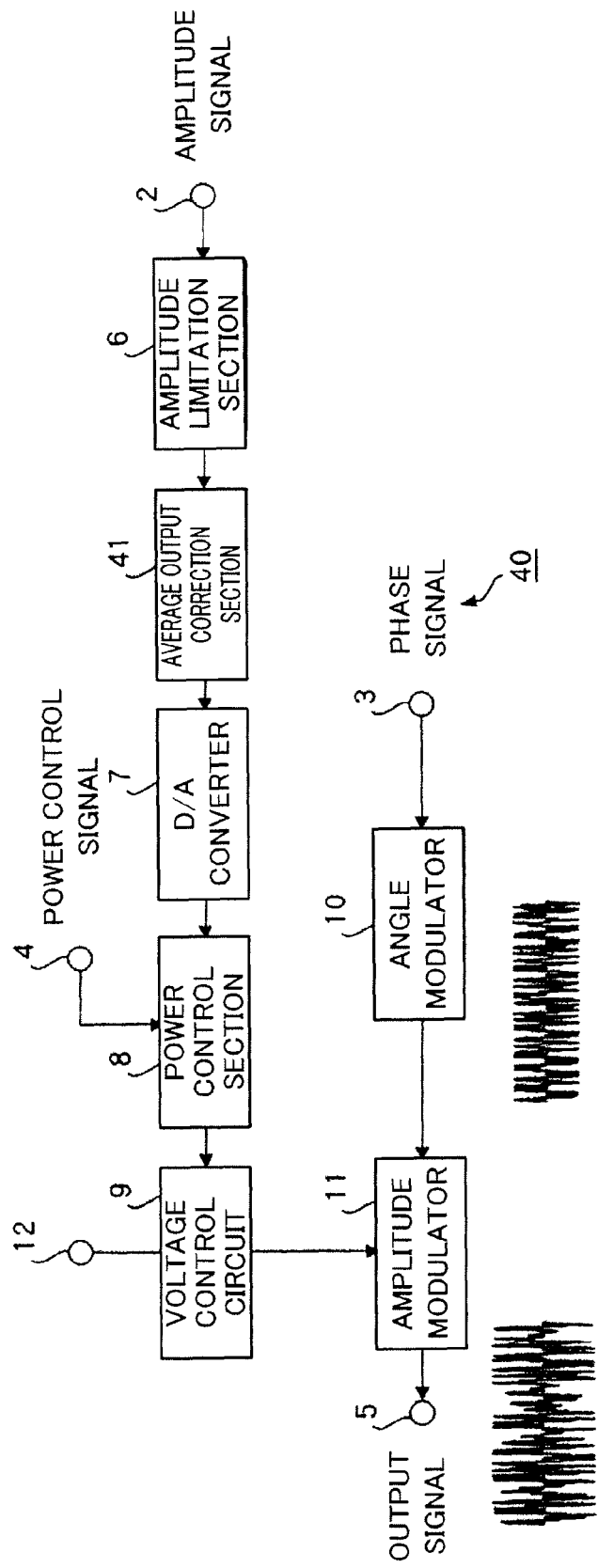
FIG. 12 is a block diagram showing a configuration of a polar modulation apparatus according to Embodiment 3 of the present invention.

FIG. 12 shows a configuration of polar modulation apparatus 40 according to present Embodiment 3. In FIG. 12, the same components as those of polar modulation apparatus 1 shown in FIG. 2 above are assigned the same reference numerals and explanations thereof will be omitted.

As shown in FIG. 12, polar modulation apparatus 40 according to present Embodiment 3 has average output correction section 41 that corrects average output of an output signal in addition to the configuration of Embodiment 1 shown in FIG. 2.

Average output correction section 41 calculates an average value of a signal outputted from amplitude limitation section 6 according to the above-described first predetermined value and/or the above-described second predetermined value and corrects the output signal based on the calculated value so that the average value is always kept equal.

Figure 13:
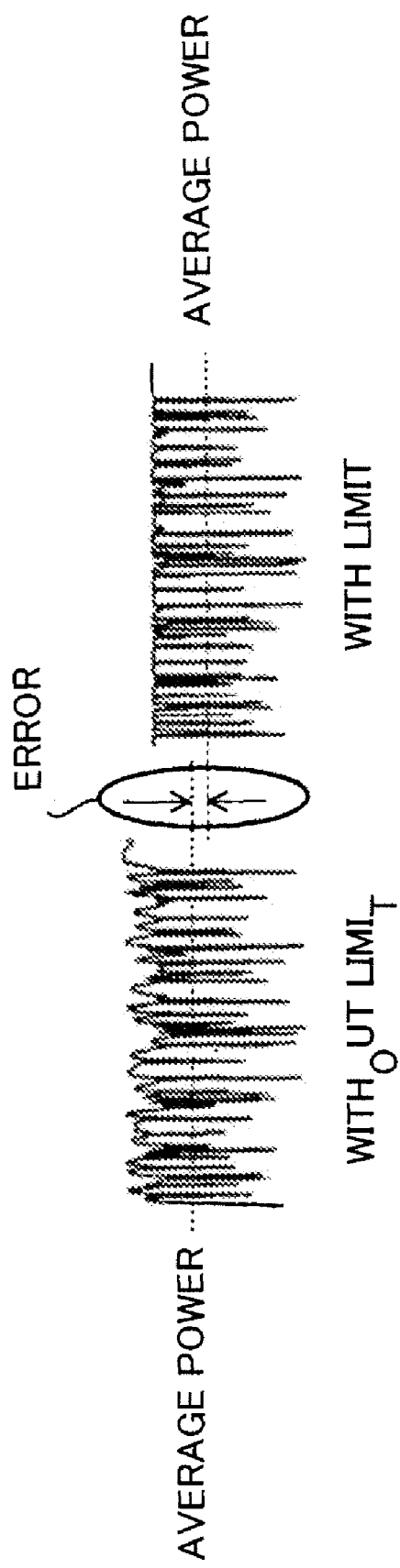
FIG. 13 shows an example of an average power change of an amplitude-limited signal according to Embodiment 3.

If amplitude limitation section 6 performs amplitude limitation, average power of the signal may change and produce an error as shown in FIG. 13, and signal quality deteriorates in such a case.

Therefore, in the present embodiment, by connecting average output correction section 41 to the output of amplitude limitation section 6, and calculating an average value of a signal outputted from amplitude limitation section 6 and correcting the output signal based on the calculated value so that the average value is always kept equal, in average output correction section 41, it is possible to avoid deterioration of signal quality.

Other Embodiments

Figure 14:
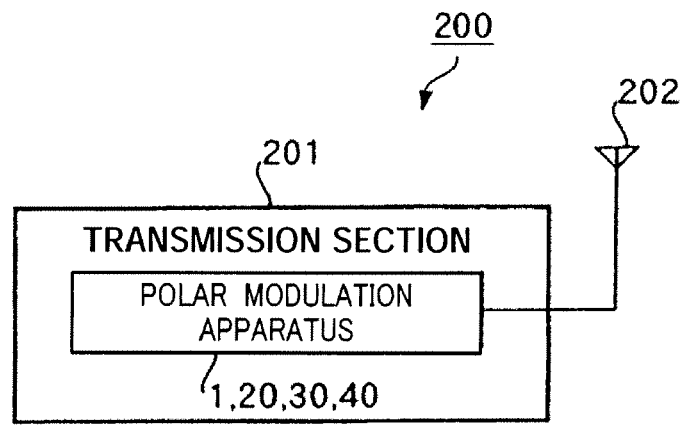
FIG. 14 is a block diagram showing a configuration of a radio transmitting apparatus according to another embodiment of the present invention.

FIG. 14 shows a configuration of a radio transmitting apparatus mounted with the polar modulation apparatus according to Embodiments 1 to 3 above. Radio transmitting apparatus 200 is configured with transmission section 201 having polar modulation apparatus 1, 20, 30 or 40 according to one of Embodiments 1 to 3 above and antenna 202 that transmits an RF phase modulated signal after amplitude modulation obtained from polar modulation apparatus 1, 20, 30 or 40.

In this configuration, by applying polar modulation apparatus 1, 20, 30 or 40 in radio transmitting apparatus 200, it is possible to reduce the dynamic range required for the D/A converter, use the dynamic range of the D/A converter to a maximum extent, reduce the circuit scale and avoid deterioration of signal quality.

Figure 15:
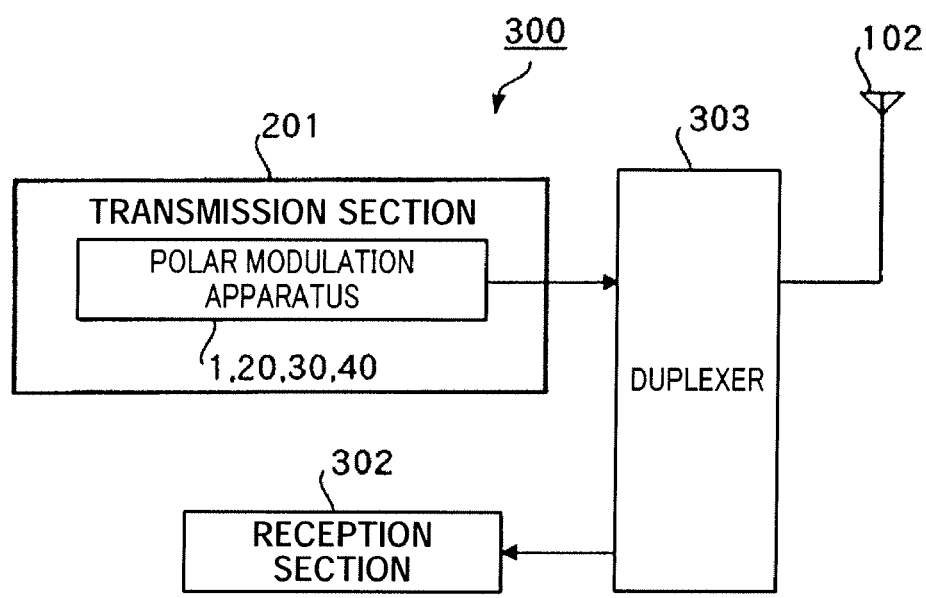
FIG. 15 is a block diagram showing a configuration of a radio communication apparatus according to another embodiment.

FIG. 15 shows a configuration of a radio communication apparatus mounted with the polar modulation apparatus according to Embodiments 1 to 3 above. Radio communication apparatus 300 is configured with transmission section 201 having polar modulation apparatus 1, 20, 30 or 40 according to one of Embodiments 1 to 3 above, reception section 302 that applies predetermined reception processing including demodulation processing to a received signal, duplexer 303 that switches between a transmission signal and a received signal and antenna 202.

In this configuration, by applying polar modulation apparatus 1, 20, 30 or 40 in radio communication apparatus 300, it is possible to reduce the dynamic range required for the D/A converter, use the dynamic range of the D/A converter to a maximum extent, reduce the circuit scale and avoid deterioration of signal quality.

The present invention is not limited to the above embodiments, but can be implemented modified in various ways.

The present application is based on Japanese Patent Application No. 2006-53912, filed on Feb. 28, 2006, the entire content of which is expressly incorporated by reference herein.

INDUSTRIAL APPLICABILITY

Even when transmission power is controlled, the present invention can limit power with a simple configuration and expand a range of transmission power control, and is widely applicable to a radio communication apparatus such as a mobile telephone.

The invention claimed is:

1. A polar modulation apparatus comprising:
   an amplitude limitation section that performs amplitude limitation on an inputted amplitude signal;
   a digital to analog conversion section that converts the digital amplitude signal amplitude-limited by the amplitude limitation section to an analog signal;
   a power control section that scales the amplitude-limited analog amplitude signal according to a transmission power control value;
   an angle modulation section that performs angle-modulation based on an inputted phase signal and outputs an angle-modulated signal; and
   an amplitude modulation section that amplitude-modulates the angle-modulated signal using the power controlled amplitude signal.

2. The polar modulation apparatus according to claim 1, wherein:
   the amplitude limitation section forms, if the inputted amplitude signal exceeds a first predetermined value, a waveform of the amplitude signal so that a level of the amplitude signal of the exceeding portion is truncated to the first predetermined value.

3. The polar modulation apparatus according to claim 1, wherein:
   the amplitude limitation section forms, if the inputted amplitude signal falls below a second predetermined value, a waveform of the amplitude signal so that a level of the amplitude signal of the lower portion is truncated to the second predetermined value.

4. The polar modulation apparatus according to claim 1, wherein:
   the amplitude limitation section forms, if the inputted amplitude signal exceeds a first predetermined value, a waveform of the amplitude signal so that the level of the amplitude signal of the exceeding portion is truncated to the first predetermined value and forms, if the inputted amplitude signal falls below a second predetermined value, the waveform of the amplitude signal so that the level of the amplitude signal of the lower portion is truncated to the second predetermined value.

5. The polar modulation apparatus according to claim 1, further comprising a compensation section provided after the amplitude limitation section for eliminating a distortion component included in an output signal of the amplitude limitation section.

6. The polar modulation apparatus according to claim 5, wherein:
   the compensation section comprises:
   a plurality of compensation tables matching transmission power control values; and
   a table changeover section that selects at least one of the plurality of compensation table sections according to the transmission power control values.

7. The polar modulation apparatus according to claim 5, wherein:
   the compensation section has an amplitude limitation function of limiting an amplitude of an inputted signal.

8. The polar modulation apparatus according to claim 4, further comprising an average output correction section provided after the amplitude limitation section for calculating an average value of a signal after amplitude limitation according to the first predetermined value, and/or the second predetermined value and correcting a signal after the amplitude limitation based on the calculated value.

* * * * *